United States Patent
Alptekin et al.

(10) Patent No.: US 9,245,892 B2
(45) Date of Patent: Jan. 26, 2016

(54) SEMICONDUCTOR STRUCTURE HAVING BURIED CONDUCTIVE ELEMENTS

(71) Applicant: International Business Machines Corporation, Armonk, NY (US)

(72) Inventors: Emre Alptekin, Fishkill, NY (US); Pooja R. Batra, White Plains, NY (US); Kangguo Cheng, Schenectady, NY (US); Ramachandra Divakaruni, Ossining, NY (US); Johnathan E. Faltermeier, Delanson, NY (US); Reinaldo A. Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 14/184,756

(22) Filed: Feb. 20, 2014

(65) Prior Publication Data

US 2015/0236024 A1    Aug. 20, 2015

(51) Int. Cl.

| H01L 27/108 | (2006.01) |
| --- | --- |
| H01L 29/76 | (2006.01) |
| H01L 29/94 | (2006.01) |
| H01L 31/119 | (2006.01) |
| H01L 21/768 | (2006.01) |
| H01L 23/48 | (2006.01) |

(52) U.S. Cl.
CPC .... *H01L 27/10829* (2013.01); *H01L 21/76898* (2013.01); *H01L 23/481* (2013.01); *H01L 27/10826* (2013.01); *H01L 27/10867* (2013.01); *H01L 27/10879* (2013.01)

(58) Field of Classification Search
CPC ............... H01L 27/1082; H01L 27/10829; H01L 27/10832; H01L 27/10861; H01L 27/10867; H01L 27/1087; H01L 27/10876; H01L 29/66181; H01L 29/945
See application file for complete search history.

(56) References Cited

U.S. PATENT DOCUMENTS

| 4,503,451 | A | 3/1985 | Lund et al. |
| --- | --- | --- | --- |
| 5,100,823 | A | 3/1992 | Yamada et al. |
| 5,202,754 | A | 4/1993 | Bertin et al. |
| 6,483,139 | B1 | 11/2002 | Arimoto et al. |
| 6,696,746 | B1 | 2/2004 | Farrar et al. |
| 6,946,389 | B2 | 9/2005 | Farrar et al. |
| 6,984,859 | B2 | 1/2006 | Ashida |
| 2014/0299882 | A1* | 10/2014 | Chan ............... H01L 29/945 257/66 |

FOREIGN PATENT DOCUMENTS

JP    02199828 A    8/1990

* cited by examiner

*Primary Examiner* — Thanhha Pham
(74) *Attorney, Agent, or Firm* — Steven J. Meyers; Trentice Bolar; Howard M. Cohn

(57) ABSTRACT

Embodiments for the present invention provide a semiconductor device and methods for fabrication. In an embodiment of the present invention, a semiconductor structure comprises a first conductor horizontally formed on a semiconductor substrate. A second conductor is vertically formed in a semiconductor stack that includes the semiconductor substrate. An oxidized region is formed proximate to the first conductor. The second conductor is formed in a manner to be in electrical communication with the first conductor. The first conductor is formed in a manner to be laterally connected to the second conductor. The first conductor is formed in a manner to not traverse beneath the oxidized region. The first conductor is formed in a manner to have a reduced link-up resistance with adjacent epitaxial material included in the semiconductor structure.

10 Claims, 7 Drawing Sheets

SEMICONDUCTOR STRUCTURE HAVING BURIED CONDUCTIVE ELEMENTS

FIELD OF THE INVENTION

The present invention relates generally to the field of semiconductor structures, and specifically to a semiconductor structures having buried conductive elements.

BACKGROUND OF THE INVENTION

Resistance to plate is a performance limiter for semiconductor structures, such as embedded dynamic random access memory (hereinafter "eDRAM") access times. eDRAM is DRAM that is embedded on the same die as an ASIC or processor. DRAM is a type of semiconductor memory which stores information as data bits in capacitors on metal-oxide-semiconductor integrated circuits. Each bit is typically stored as an amount of electrical charge in a storage cell consisting of a capacitor and a transistor. Conventional semiconductor DRAM devices are formed in bulk substrate semiconductor material by implanting a well of either p-type or n-type material in a wafer of either type of material. Gates and source/drain diffusions are then manufactured using commonly known processes. Memory cells may be arrayed in a matrix manner.

Ion implantation is essential to modern integrated-circuit manufacturing. Conventional doping or modification of silicon and other semiconductor wafers relies on the technology, which may involve generating an ion beam and steering it into the substrate so that the ions come to rest beneath the surface of the substrate. Ions may be allowed to travel through a beam line at the energy at which they were extracted from a source material, or they can be accelerated or decelerated by direct current or radio-frequency electric fields. Conventional processes for implanted silicon create a high resistance connection (i.e. a connection that resists the flow of electricity therein) to the backside of capacitors, such as metal-on-metal capacitors, which can lead to elevated delays when such chips are operated at high frequency.

SUMMARY

Embodiments for the present invention provide a semiconductor device and methods for fabrication. In an embodiment of the present invention, a semiconductor structure comprises a first conductor horizontally formed on a semiconductor substrate. A second conductor is vertically formed in a semiconductor stack that includes the semiconductor substrate. An oxidized region is formed proximate to the first conductor. The second conductor is formed in a manner to be in electrical communication with the first conductor. The first conductor is formed in a manner to be laterally connected to the second conductor. The first conductor is formed in a manner to not traverse beneath the oxidized region. The first conductor is formed in a manner to have a reduced link-up resistance with adjacent epitaxial material included in the semiconductor structure.

DETAILED DESCRIPTION

Figure 3:
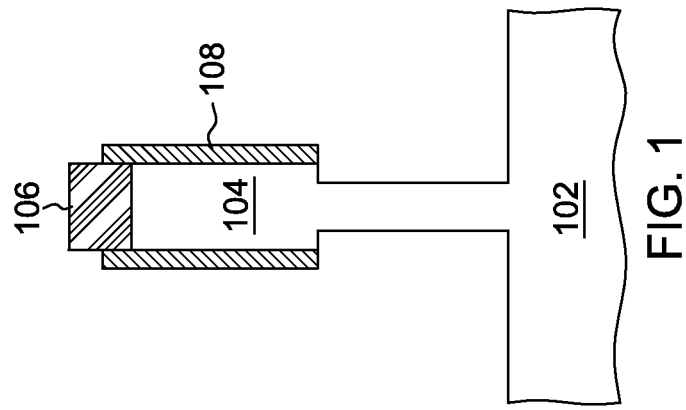
FIG. 3 depicts additional semiconductor fabrication steps, in accordance with an embodiment of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

Resistance to plate is a performance limiter for semiconductor structures, such as embedded dynamic random access memory (hereinafter "eDRAM") access times. eDRAM is DRAM that is embedded on the same die as an ASIC or processor. DRAM is a type of memory which stores information as data bits in integrated circuits (hereinafter "IC"). Each bit is typically stored as an amount of electrical charge in a storage cell consisting of a capacitor and a transistor. Semiconductor DRAM devices may be formed in bulk substrate semiconductor material by implanting a well of either p-type or n-type material in a wafer of either type of material. Gates and source/drain diffusions can then manufactured using commonly known processes. Memory cells, such as those included in eDRAM, can be arrayed in a matrix manner.

Ion implantation can be utilized for IC manufacturing. Doping or modification of silicon and other semiconductor wafers can involve generating an ion beam and steering the ion beam into the substrate so that the ions come to rest beneath the surface of the substrate. Ions may be allowed to travel through a beam line at the energy at which they were extracted from a source material, or they can be accelerated or decelerated by direct current or radio-frequency electric fields. Ion implantation of silicon can create a high resistance connection (i.e. a connection that resists the flow of electricity therein) to the backside of capacitors, such as metal-on-metal capacitors, which can lead to elevated delays when such chips are operated at a high frequency.

Embodiments of the present invention seek to provide a semiconductor structure comprising a buried conductor having a low reduced connection. In an embodiment, the semiconductor structure includes a metal-insulator-metal (hereinafter "MIM") trench capacitor; through silicon via (hereinafter "TSV"); and self-aligned landing pad. The semiconductor structure can include a dielectrically isolated fin structure. The semiconductor structure can include an epitaxially grown buried conductor which may, for example, be utilized for wiring, biasing, and/or grounding. Sequential steps of an exemplary embodiment of a semiconductor structure are described below with respect to the schematic illustrations of FIGS. 1-10. Similar reference numerals denote similar features.

Figure 1:
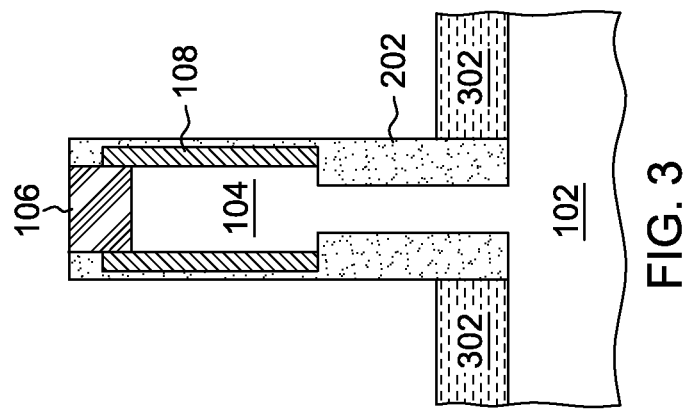
FIG. 1 depicts semiconductor fabrication steps, in accordance with an embodiment of the present invention.

FIG. 1 depicts semiconductor fabrication steps for a semiconductor structure, in accordance with an embodiment of the present invention. A layer, for example, including nitride, can be deposited on substrate 102 to form cap 106. Substrate 102 can be a semiconducting material, such as silicon (hereinafter "Si"), silicon germanium (hereinafter "SiGe"), and indium gallium arsenide (hereinafter "InGaAs"). Fin 104 and cap 106 are formed on substrate 102 by, for example, an appropriate etch process. Fin 104 can be formed in manner to vertically extend above substrate 102, and may be used to form source, drain, and channel regions (not shown). Spacer material, which may include insulating material, such as silicon nitride (hereinafter "SiN"), silicon dioxide (hereinafter "$SiO_2$"), and hafnium oxide (hereinafter "$HfO_2$"), may be deposited on substrate 102 and the excess material thereof removed by, for example, an etch process, to form spacers 108. An isotopic etch may be used to remove excess material from substrate 102 laterally and further define fin 104.

Figure 2:
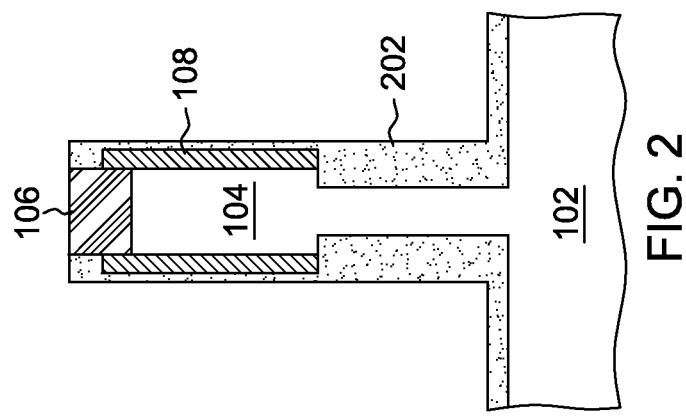
FIG. 2 depicts additional semiconductor fabrication steps, in accordance with an embodiment of the present invention.
Figure 5:
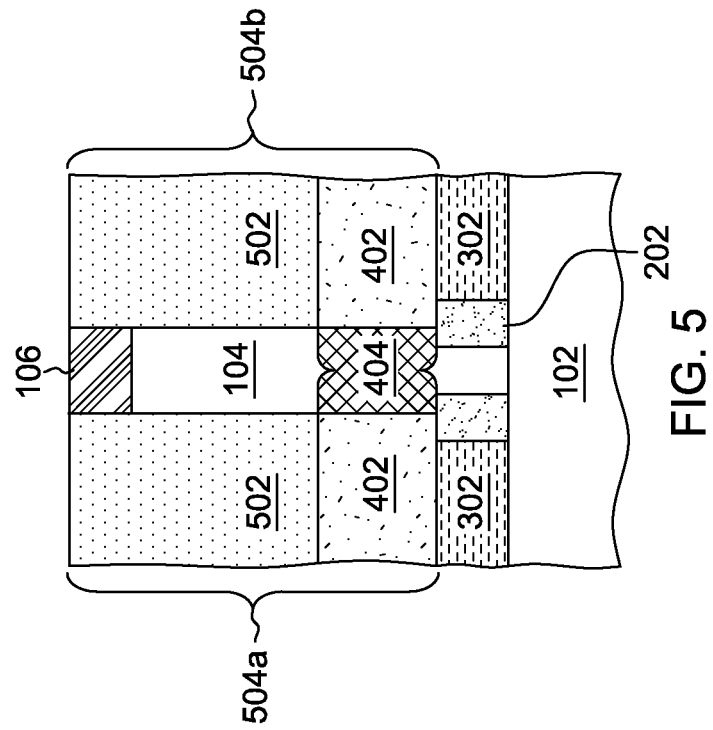
FIG. 5 depicts additional semiconductor fabrication steps, in accordance with an embodiment of the present invention.
Figure 4:
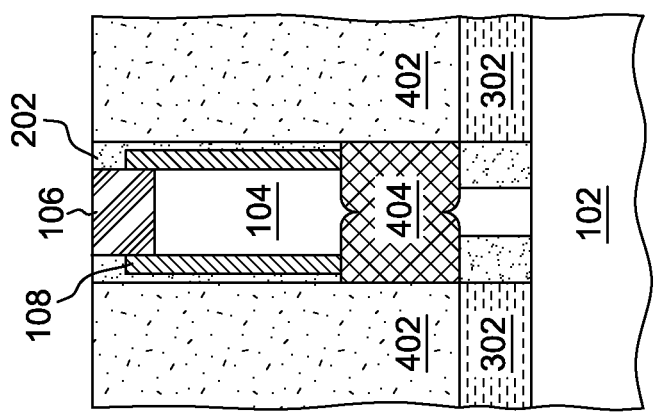
FIG. 4 depicts additional semiconductor fabrication steps, in accordance with an embodiment of the present invention.

FIG. 2 depicts additional semiconductor fabrication steps, in accordance with an embodiment of the present invention. Dielectric 202 is formed on substrate 102, cap 106, and spacer 108, for example, by chemical vapor deposition (hereinafter "CVD"). Dielectric 202 includes insulating material, such as SiN, $SiO_2$, and $HfO_2$. FIG. 3 depicts additional semiconductor fabrication steps, in accordance with an embodiment of the present invention. Excess dielectric 202 is removed by an appropriate method, such as reactive ion etching (hereinafter "RIE"). Epitaxial layer 302 is formed on substrate 102 using an appropriate method, such as epitaxy. Epitaxial layer 302 includes semiconductor material, such as Si, SiGe, or silicon-phosphorus (hereinafter "SiP"). Epitaxial layer 302 may be doped with an n-type or p-type dopant at a predetermined doping level. In an embodiment, epitaxial layer 302 is doped to 5E20. In an embodiment, epitaxial layer 302 may undergo doping either before or after epitaxial growth. In certain embodiments, epitaxial layer 302 is preceded by a recess etch, such as an isotropic or sigma-shaped etch, to reduce link-up resistance between adjacent epitaxial regions. Link-up (also referred to as "tip") resistance is the resistance between two points, for example, A and B, wherein point A is the point where the doping concentration begins to decrease below its solubility limit and doping induced concentration begins to decrease; and point B is the point where the channel can be considered to begin FIG. 4 depicts additional semiconductor fabrication steps, in accordance with an embodiment of the present invention. Dielectric 402 can be deposited on epitaxial layer 302 using an appropriate process. In an embodiment, spacer 108 structurally supports fin 104 during the formation of region 404 by, for example, thermal oxidation. Region 404 is depicted with a pinched portion located therein to illustrate that the oxidation of region 404 may not be uniform. Fin 104 is protected from the oxidation by spacers 108, and is electrically isolated from substrate 102 by region 404. FIG. 5 depicts additional semiconductor fabrication steps, in accordance with an embodiment of the present invention. Spacer 108 and excess dielectric 202 is removed by, for example, etching dielectric 402 and dielectric 202 selective to fin 104 and region 404. Shallow trench isolations (hereinafter "STI") 504a and 504b may be formed by depositing dielectric 502 on dielectric 402. Excess material may be removed from STI 504a,b by an appropriate process, such as chemical-mechanical planarization (hereinafter "CMP").

Figure 6:
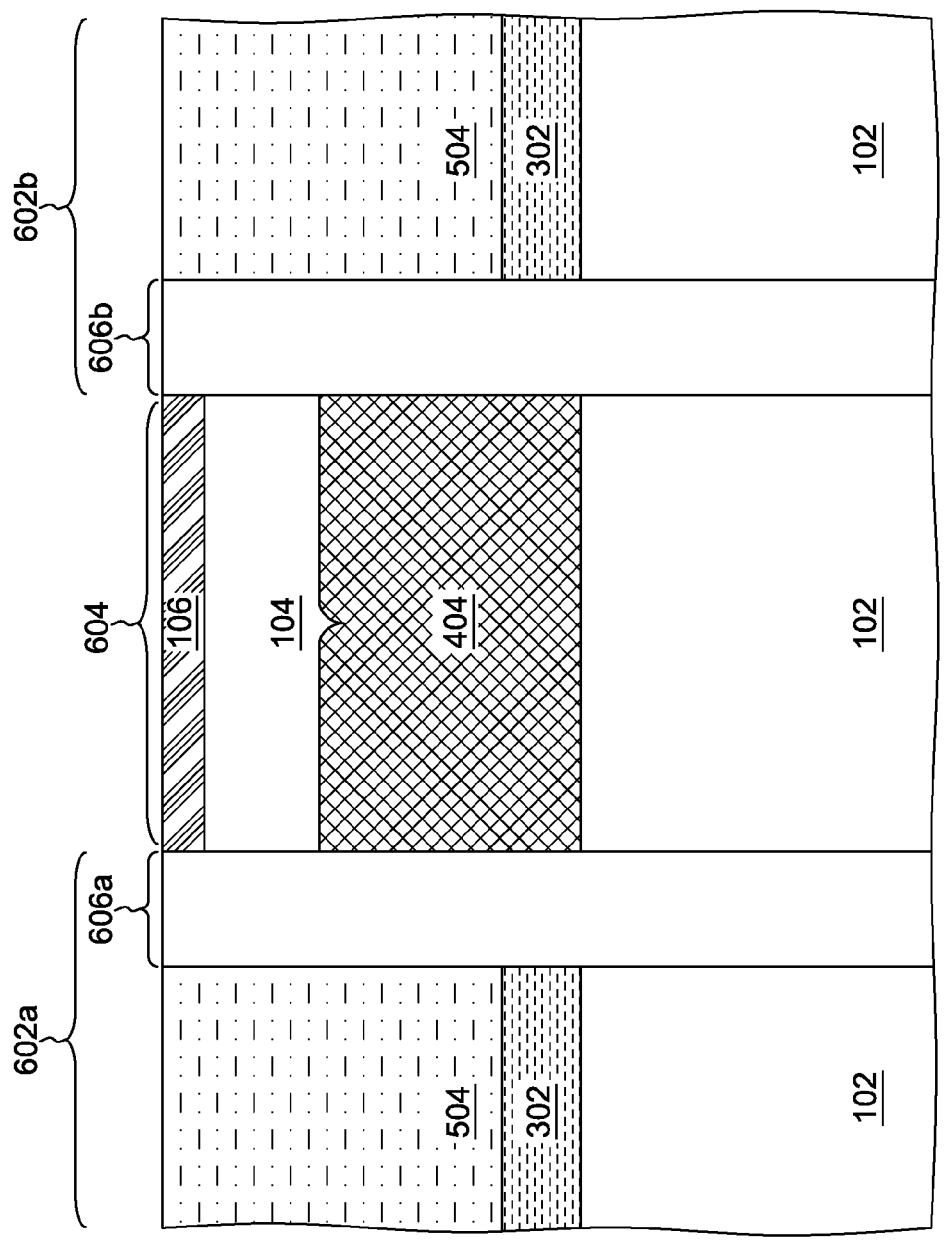
FIG. 6 depicts additional semiconductor fabrication steps, in accordance with an embodiment of the present invention.

FIG. 6 depicts additional semiconductor fabrication steps, in accordance with an embodiment of the present invention. For clarity's sake, un-oxidized portions of dielectric 202 are included in region 404. Regions 602a, 604, and 602b correspond to the left, middle, and right portions of the semiconductor structure, respectively. Trenches 606a and 606b may be formed in STI 504a and 504b, respectively, epitaxial layer 302, and substrate 102 using an appropriate process, such as etching. In an embodiment, trenches 606a and 606b are formed proximate to fin 104. In other embodiments, trenches 606a,b are formed distal to fin 104 (discussed below). In certain embodiments, trench 606b is not formed. The resulting semiconductor structure depicted in FIG. 6 includes a buried conductor, epitaxial layer 302, which may be used in a variety of applications, for example, for wiring, biasing, and/or grounding purposes as well as a connection to a common backside plate.

Figure 7:
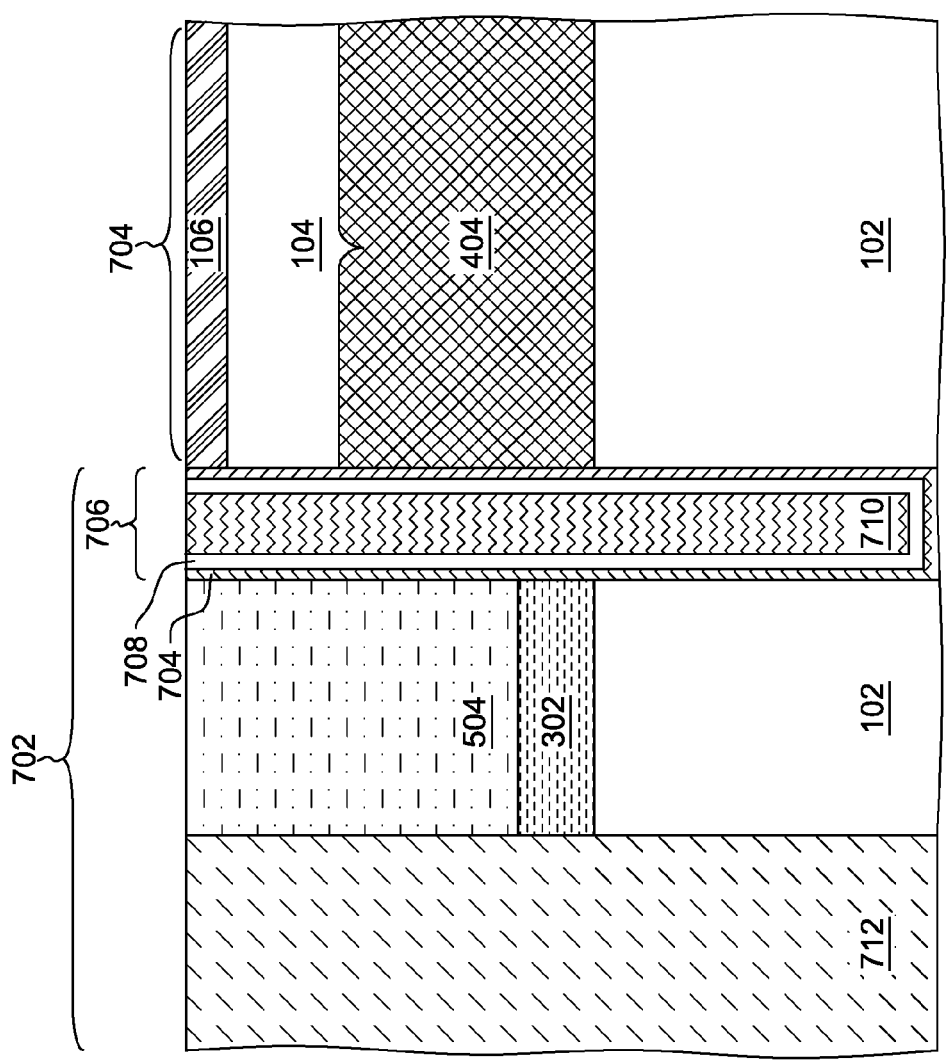
FIG. 7 depicts additional semiconductor fabrication steps, in accordance with an embodiment of the present invention.

FIGS. 7-10 depict additional embodiments of the present invention. For the sake of clarity, only the left and middle portions, regions 702 and 704, respectively, of the structure are depicted, since structures formed in region 702 may also be formed in the right portion of the structure. FIG. 7 depicts additional fabrication steps, in accordance with an embodiment of the present invention. Specifically, FIG. 7 depicts an embodiment wherein a buried conductor is formed in a manner to be in electrical communication with a capacitor and a contact. FIG. 7 includes the same structure depicted in FIG. 6, wherein region 702, trench 706, and region 704 correspond to region 602a, trench 606a, and region 604, respectively. A metal-insulator-metal capacitor is formed in trench 706 by, for example, depositing conductor 704, which includes conductive material, using an appropriate process, such as CVD or atomic layer deposition (hereinafter "ALD"). Conductor 704 may include Cu, W, aluminum (hereinafter "Al"), titanium nitride (hereinafter "TiN").

Insulator 708 can be formed by depositing insulator material, such as SiN, $SiO_2$, and $HfO_2$ using an appropriate process. Conductor 710, which includes conductive material, is deposited in trench 706 using an appropriate process. Excess material may then be removed from conductor 704, insulator 708, and conductor 710, for example by CMP. A mask may be deposited on the resulting structure and trench can be etched in dielectric 504, epitaxial layer 302, and substrate 102 and filled with conductive material to form contact 712. Contact 712 can include conducting material, such as W, Cu, TiN, Al.

Figure 8:
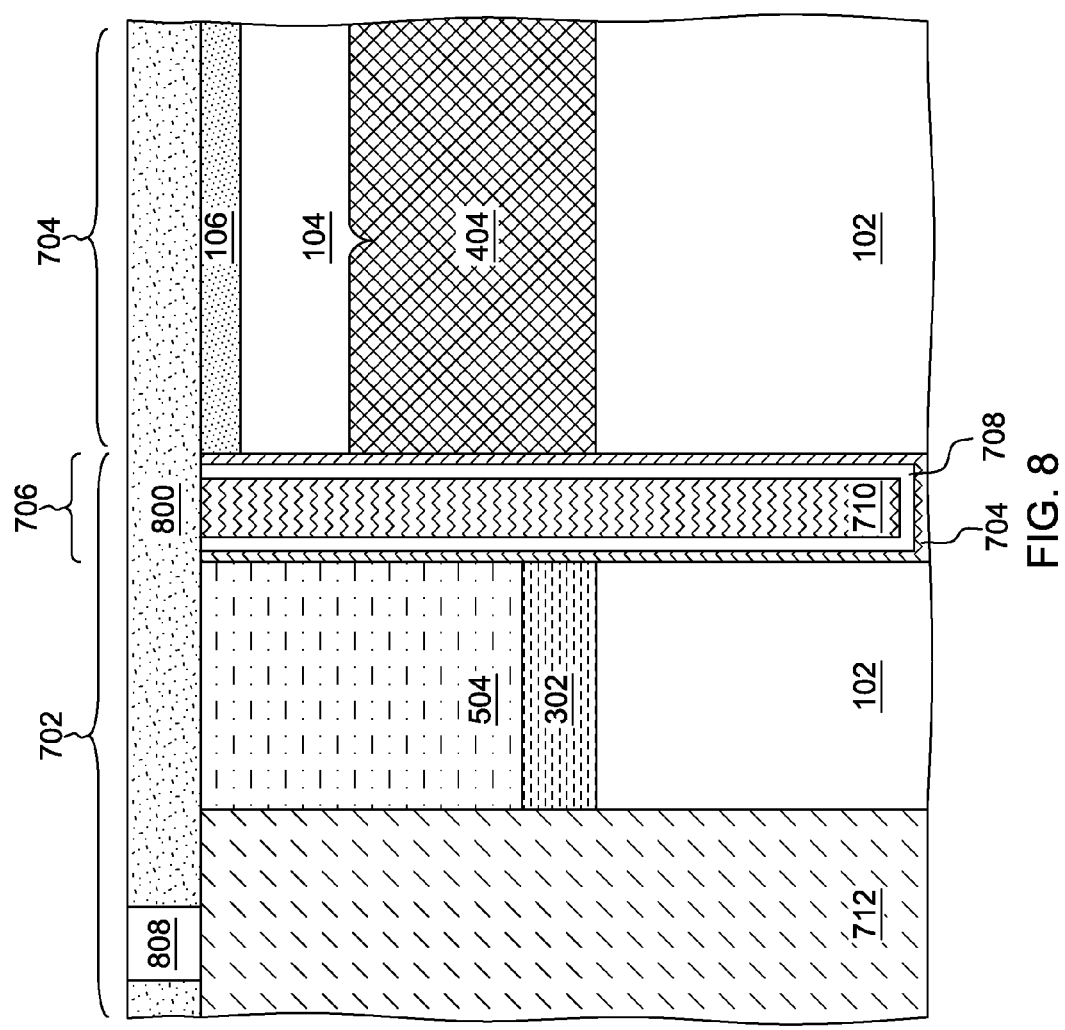
FIG. 8 depicts additional semiconductor fabrication steps, in accordance with an embodiment of the present invention.

FIG. 8 depicts additional semiconductor fabrication steps, in accordance with an embodiment of the present invention. Dielectric 800 may be formed on regions 702 and 704 using an appropriate process. Contact 808 may be formed by depositing a mask and etching a trench in dielectric 800 and depositing conductive material therein using an appropriate process. Excess material may be removed from contact 808 and/or dielectric 800 by, for example, CMP.

Figure 9:
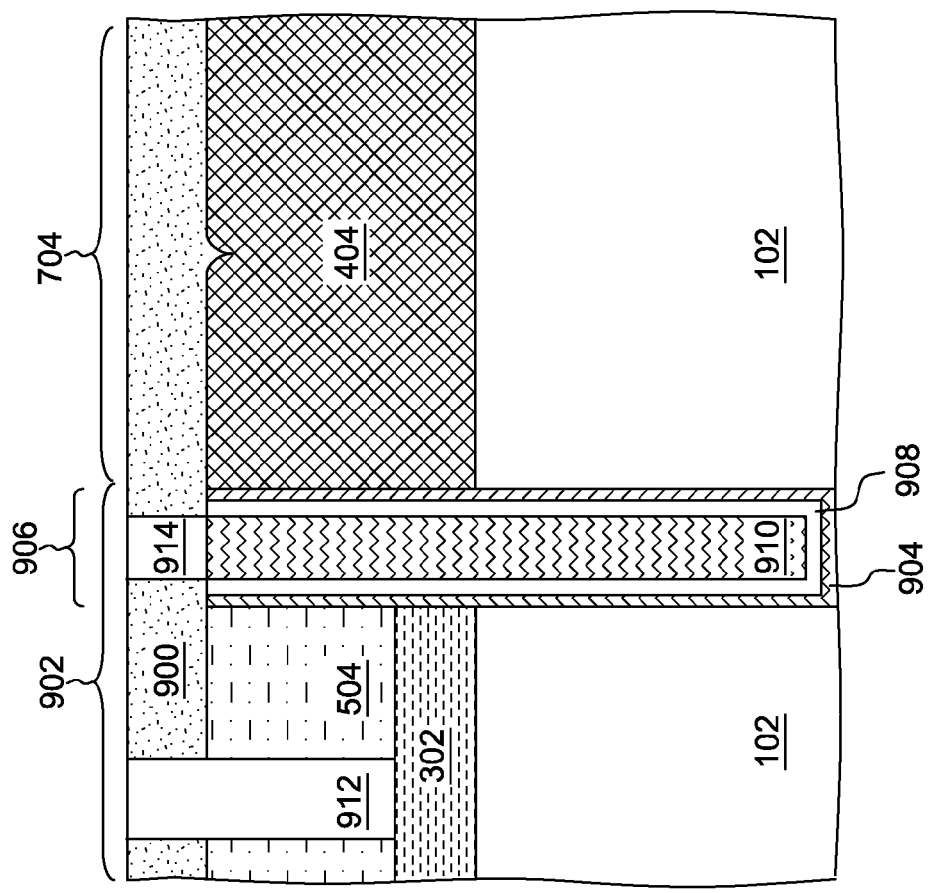
FIG. 9 depicts additional semiconductor fabrication steps, in accordance with an embodiment of the present invention.

FIG. 9 depicts additional semiconductor fabrication steps, in accordance with an embodiment of the present invention. FIG. 9 expands on the embodiment of FIG. 6, wherein regions 902 and 904 correspond to regions 602*a* and 604, respectively. Similarly, trench 906 corresponds to trench 606*a*. Specifically, spacer 108, cap 106, fin 104 and the portion of dielectric 504*a* that extends above region 404 are removed, for example, by etching. Trench 906 includes a metal-insulator-metal capacitor that is formed in a similar fashion as the capacitor formed in trench 706 (discussed above). Capacitors formed in trench 706 can include conductors 904 and 910 as well as insulator 908. Excess material can be removed from conductors 904 and 910 and insulator 908 the capacitor by CMP. Dielectric 900 can be deposited on dielectric 504 and region 404 using an appropriate process. A mask may be deposited on dielectric 900, trenches etched, and conductive material deposited to form contacts 912 and 914. Excess material may be removed from contacts 912 and 914 using an appropriate process.

Figure 10:
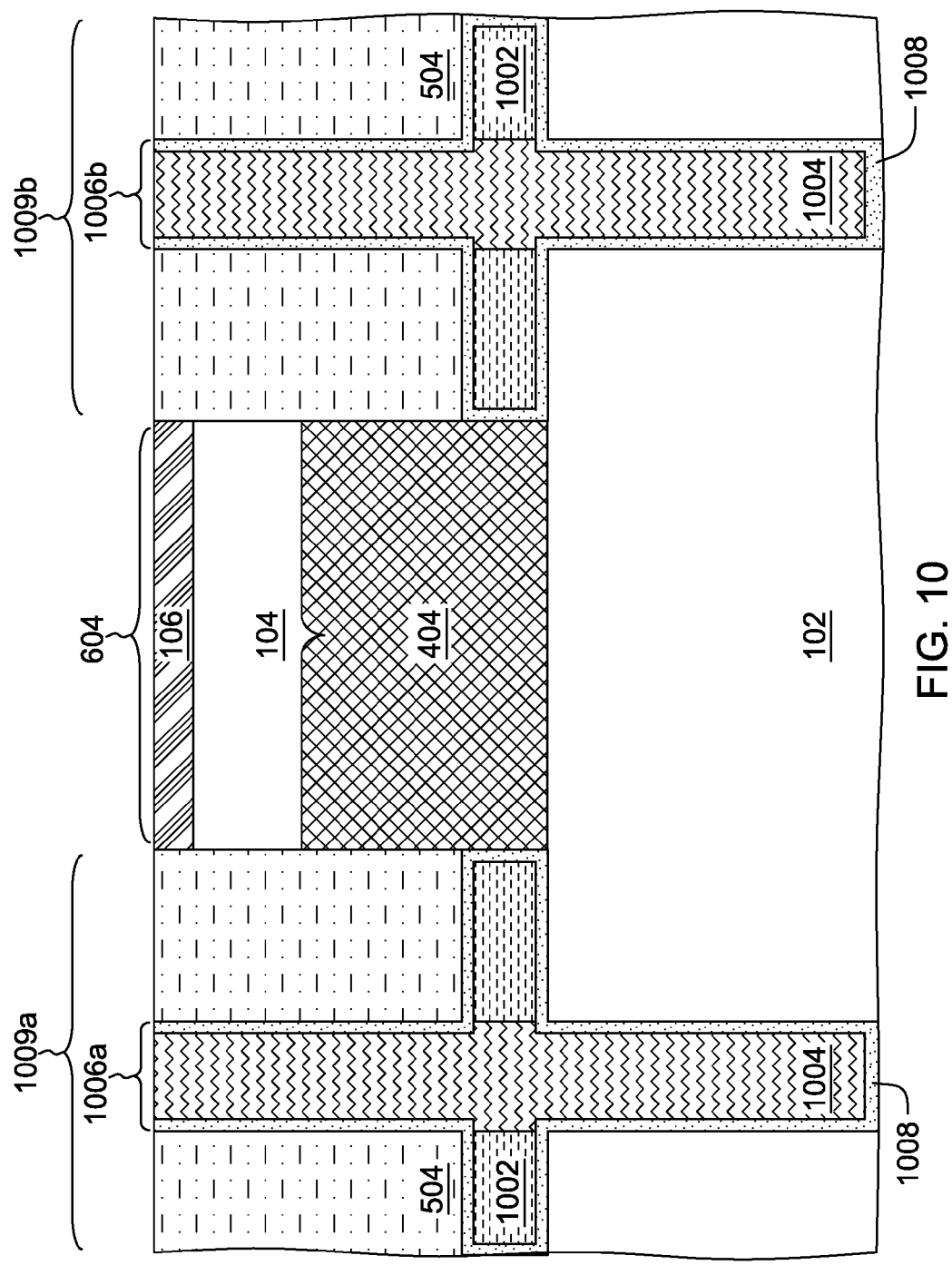
FIG. 10 depicts additional semiconductor fabrication steps, in accordance with an embodiment of the present invention.

FIG. 10 depicts additional semiconductor fabrication steps, in accordance with an embodiment of the present invention. Specifically, the embodiment depicted in FIG. 10 reflects trenches etched distally in relation to the fin (discussed above), wherein regions 1009*a*, 1004, and 1009*b* correspond to regions 602*a*, 604, and 602*b*, respectively. Although formed distal to fin 104, trenches 1006*a,b* may be formed in STI 504, epitaxial layer 1002, and substrate 102 in a similar fashion that trenches 606*a,b* are formed therein (discussed above). Epitaxial layer 302 may be removed using an appropriate process, such as a lateral etch. Liner 1008 may be formed by depositing insulating material, such as SiN, $SiO_2$, and $HfO_2$, using an appropriate process. Landing pads 1002 and through-silicon-vias (hereinafter "TSV") 1004 may be formed by depositing a mask and a conductive material using an appropriate process, such as atomic layer deposition. In certain embodiments, landing pads 1002 do not extend under fin 104. In other embodiments, landing pads 1002 are self-aligned to TSVs 1004. The location of landing pads 1002 relative to TSVs 1004 reduces the "keep out zone" or area taken by the landing pad, within which no active design structures can be placed.

What is claimed is:

1. A semiconductor structure comprising:
   a first conductor horizontally formed on a semiconductor substrate;
   a second conductor vertically formed in a semiconductor stack that includes the semiconductor substrate;
   an oxidized region formed proximate to the first conductor;
   wherein the second conductor is formed in a manner to be in electrical communication with the first conductor;
   wherein the first conductor is formed in a manner to be laterally connected to the second conductor; and
   wherein the first conductor is formed in a manner to not traverse beneath the oxidized region; and
   wherein the first conductor is formed in a manner to have a reduced link-up resistance with adjacent epitaxial material included in the semiconductor structure.

2. The semiconductor structure of claim 1, wherein the first conductor includes epitaxially grown conducting material.

3. The semiconductor structure of claim 2, wherein the epitaxially grown conducting material includes an n-type or p-type dopant.

4. The semiconductor structure of claim 1, wherein the first conductor is in electrical communication with a common backside plate.

5. The semiconductor structure of claim 1, wherein the second conductor is a trench metal-insulator-metal capacitor.

6. The semiconductor structure of claim 1, further comprising a fin located in the semiconductor stack.

7. The semiconductor structure of claim 6, wherein the second conductor is located proximate to the fin.

8. The semiconductor structure of claim 1, wherein the second conductor is formed distal or proximate to the oxidized region.

9. The semiconductor structure of claim 1, wherein the second conductor is a through-silicon-via.

10. The semiconductor structure of claim 1, wherein the first conductor is a self-aligned landing pad.

* * * * *